United States Patent [19]

Brekelmans

[11] Patent Number: 5,742,898
[45] Date of Patent: Apr. 21, 1998

[54] TUNING SYSTEM WITH DC-DC CONVERTER

[75] Inventor: Johannes H. A. Brekelmans, Singapore, Singapore

[73] Assignee: U.S. Philips Corporation, New York, N.Y.

[21] Appl. No.: 557,446

[22] Filed: Nov. 14, 1995

[30] Foreign Application Priority Data

Nov. 15, 1994 [EP] European Pat. Off. ............ 94203329

[51] Int. Cl.$^6$ .......................................... H04B 1/18
[52] U.S. Cl. ..................... 455/193.1; 455/195.1; 455/196.1
[58] Field of Search ................ 455/193.1, 193.2, 455/193.3, 195.1, 343, 121, 120, 122, 123, 289, 290, 196.1–197.3, 255–257; 348/730, 731, 733

[56] References Cited

U.S. PATENT DOCUMENTS 4,630,118  12/1986  Suzuki ........................ 455/195.1
5,349,700  9/1994  Parker ........................ 455/193.2
5,524,288  6/1996  Monge Navarro et al. ........ 455/193.2

FOREIGN PATENT DOCUMENTS 55-33353   3/1980  Japan .
63-18712   1/1988  Japan .................. H03J 5/00
5-152985   6/1993  Japan .
6-188687   7/1994  Japan .

Primary Examiner—Nguyen Vo
Attorney, Agent, or Firm—Edward W. Goodman

[57] ABSTRACT

In a tuning system, a DC-DC converter DDC provides a tuning control voltage Vt for a tuner TUN. The DC-DC converter DDC is in the form of a series arrangement of an AC source CAC, an inductive element IND and a rectifier circuit REC. The AC signal provided by the AC source Vac1 is controlled by a tuning error signal Se from a tuning detector circuit TED. The inductive element IND transforms this AC signal Vac1 into an AC signal of higher amplitude Vac2. The latter AC signal Vac2 is rectified to provide the tuning control voltage Vt. In effect, the DC-DC converter DDC is part of a tuning control loop. This tuning control loop TUN, TED, DDC determines the output voltage of the DC-DC converter Vt.

5 Claims, 5 Drawing Sheets

TUNING SYSTEM WITH DC-DC CONVERTER

BACKGROUND OF THE INVENTION

1. Field of the Invention

The invention relates to tuning systems, multi-media apparatuses, receivers and integrated circuits.

Tuning systems are used, for example, to control television receiver tuners. A tuner effectuates a signal selection in the frequency domain by converting a desired input signal to a fixed intermediate frequency. In many implementations, the frequency conversion is voltage controlled. In such implementations, the tuning system synthesizes a tuning control voltage in accordance with the desired input signal frequency.

Most of the functional parts of a tuning system are nowadays housed in one or more integrated circuits. For example, frequency synthesizer IC's are commercially available comprising synchronization detectors, programmable dividers, loop amplifiers, etc. Only a limited number of discrete electronic components are needed, in combination with one or more synthesizer IC's, to implement a tuning system.

A relatively new field of use for tunings systems are multi-media apparatuses. A multi-media apparatus can be seen as an apparatus which may access various sources and types of information. For example, it may access video information from a Compact Disc (CD) at a remote central distribution center, to which the multi-media apparatus is connected via a transmission network. This remote central distribution center may distribute various types of information in frequency division multiplex. To select the desired type of information, the multi-media apparatus will have to be equipped with a tuning system.

A further example of a multi-media apparatus is a personal computer having a TV broadcast reception plug-in board connected to its local bus. With such a plug-in board, the personal computer apparatus can function as a television receiver. The plug-in board will have to comprise a tuning system for selecting the desired TV channel to be displayed.

2. Description of the Related Art

The "Kokai" publication No. 63-18712 describes a tuning system comprising a tuner and a tuning detector for providing a tuning error signal which depends on the tuning state of said tuner, shown in FIGS. 1A and 1B of this specification.

In the known tuning system, a low value tuning voltage is generated in a channel selection voltage generating circuit 13, which is preceded by a control circuit 14. One of the signals that controls the generation of the low value tuning voltage, is an AFC signal. The AFC signal indicates the tuning error of a tuner 5, that is, the deviation of the actual tuning state from the desired tuning state. A VIF part 6 derives the AFC signal from an output signal of the tuner 5.

The supply voltage of the channel selection voltage generating circuit 13 is 5 volt. Hence, the low value tuning voltage is confined to a range between 0 and 5 volt. A DC amplifier 16 scales the low value tuning voltage up to a high value tuning voltage in a range between 0 and 30 volts. The high value tuning voltage, provided by the amplifier 16, is supplied to the tuner 5. The extension of the tuning voltage range is needed to tune over the desired reception bands.

The DC amplifier 16 receives its supply voltage from a 30 volt power supply 3. All the other functional parts of the -known tuning system are powered by a stabilized 5 volt power supply 2. Both power supplies 2 and 3 derive their respective supply voltages from a source 1, whose nature is not specified.

The known tuning system can be implemented on a board suitable to be plugged into a master connection unit of a receiver and, in particular, of a multi-media apparatus. Many receivers and, in particular, multi-media apparatuses, have such a master connection unit according to a standardized interface for easily plugging in or out special function boards. This modular build-up provides flexibility in extending the functionality of a multi-media apparatus or a receiver.

However, there is a drawback to the use of the known tuning system in a special function board. Next to the commonly used 5 volt supply 2 voltage (shown connected to other circuits 4), the 30 volt supply voltage, for the amplifier 16, needs to be accounted for in the interface. Most other special function boards will not require the 30 volt supply voltage. This means that a portion of the interface capacity needs to be reserved for one particular part on an optional board. This is undesirable: interface capacity is uneconomically used. Furthermore, special provisions are needed to generate the 30 volt supply voltage.

SUMMARY OF THE INVENTION

It is an object of invention to provide an above-identified type of tuning system which is more suitable for use in a receiver and, in particular, a multi-media apparatus of modular build-up. Such a tuning system is characterized in that the tuning system further comprises a controllable DC-DC converter whose output voltage depends on the tuning error signal; and tuning means for varying the tuning state of said tuner in response to the output voltage of the controllable DC-DC converter. In addition, the invention provides a multi-media apparatus as having a tuning system comprising a tuner and a tuning detector for providing a tuning error signal which depends on the tuning state of said tuner, characterized in that the tuning system further comprises a controllable DC-DC converter whose output voltage depends on the tuning error signal; and tuning means for varying the tuning state of said tuner in response to the output voltage of the controllable DC-DC converter, a receiver having a tuning system comprising a tuner and a tuning detector for providing a tuning error signal which depends on the tuning state of said tuner, characterized in that the tuning system further comprises a controllable DC-DC converter whose output voltage depends on the tuning error signal; and tuning means for varying the tuning state of said tuner in response to the output voltage of the controllable DC-DC converter, and an integrated circuit having a tuning system comprising a tuner and a tuning detector for providing a tuning error signal which depends on the tuning state of said tuner, characterized in that the tuning system further comprises a controllable DC-DC converter whose output voltage depends on the tuning error signal; and tuning means for varying the tuning state of said tuner in response to the output voltage of the controllable DC-DC converter.

Briefly, in the invention, a controllable DC-DC converter provides an output voltage which depends on a tuning error signal. A tuning element varies the the tuning state of the tuner, in response to the output voltage of the controllable DC-DC converter.

The DC-DC converter output voltage, used for tuning, can exceed the supply voltage which powers the active elements of the DC-DC converter. Hence, a single supply voltage of relatively low value, for example a 5 volt supply voltage, can be used to power all the functional parts of the tuning system. In contrast to the prior art tuning system, an additional supply voltage of 30 volt is not required.

To arrange a DC-DC converter within a tuning system may seem unwise. Most DC-DC converters comprise an inductive element through which an AC signal flows. Accordingly, the inductive element emits a (electro-) magnetic field. This (electro-) magnetic field may cause interference. For example, there is a serious risk that the (electro-) magnetic field, produced by the DC-DC converter, interferes with a desired signal to be received. This is because the tuner input circuitry is very sensitive to (electro-) magnetic fields.

In the invention, however, the DC-DC converter doesn't have to provide much output power. This is due to the fact that the output voltage of the DC-DC converter is applied to tuning elements, for example, varicap diodes or MOS transistors, which have a high impedance. Consequently, the current drawn from the DC-DC converter is relatively low, for example, in the order of a few micro-Amperes. This means that the signal power which flows through the inductive element is relatively low. As a result, the (electro-) magnetic field emitted by the DC-DC converter is also relatively weak.

BRIEF DESCRIPTION OF THE DRAWINGS

These and other aspects of the invention will be apparent from and elucidated with reference to the embodiments described hereinafter.

In the drawings.

Like reference numerals designate like elements throughout the drawings.

DESCRIPTION OF THE PREFERRED EMBODIMENTS

First, three embodiments of tuning systems according to the invention are discussed. Subsequent, implementations of these embodiments are presented. Next, advantages are highlighted with reference to these embodiments and implementations. Finally, some alternatives to the presented embodiments and implementations are touched upon.

Figure 2:
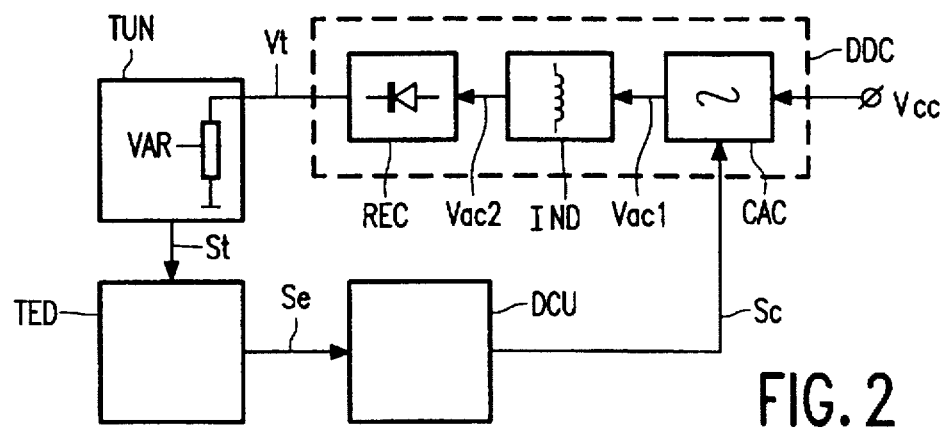
FIG. 2 shows a first embodiment of a tuning system according to the invention.

FIG. 2 is a block schematic diagram showing technical features of the invention: a tuner TUN which incorporates a tuning element VAR, a tuning error detector TED, a DC-DC converter DDC, and a controller DCU. The DC-DC converter comprises an AC source CAC, an inductive element IND and a rectifier circuit REC.

FIG. 2 also represents a first embodiment of a tuning system according to the invention. The tuning error detector TED receives an output signal St from tuner TUN. The output signal St carries information on the tuning state of the tuner TUN. Tuning error detector TED compares the tuning state encompassed in signal St with a desired tuning state. As a result of this comparison, tuning error detector TED produces an tuning error signal Se.

The controller DCU controls the AC source CAC of the DC-DC converter in response to this tuning error signal Se. To that end, the controller DCU provides a DC-DC converter control signal Sc to AC source CAC. This control signal Sc affects at least one property of the AC signal Vac1, which the AC source CAC supplies to the inductive element IND, such that the amplitude of AC signal Vac2, which is taken from the inductive element IND, varies as a function of the control signal Sc. As a result, the DC voltage Vt, provided by the rectifier circuit REC, also varies as a function of this control signal Sc. The DC voltage Vt produced by the DC-DC converter is supplied to a tuning element VAR. The tuning element VAR varies the tuning state of said tuner in response to this voltage Vt. Hence, the DC output voltage Vt provided by the DC-DC converter DDC determines the tuning state of tuner TUN.

The DC-DC converter is part of a tuning control loop, which further comprises the tuner TUN, the tuning error detector TED and the controller DCU. If the tuning state of tuner TUN deviates from the desired state, the tuning control loop will force the DC-DC converter to change its output voltage Vt such that the desired tuning state is obtained. Thus, the tuning control loop effectively stabilizes the DC output voltage Vt of the DC-DC converter DDC at a steady state value. The steady state value is defined by the desired tuning state, on the one hand, and the tuning characteristics of the tuner TUN, on the other hand.

Figure 3:
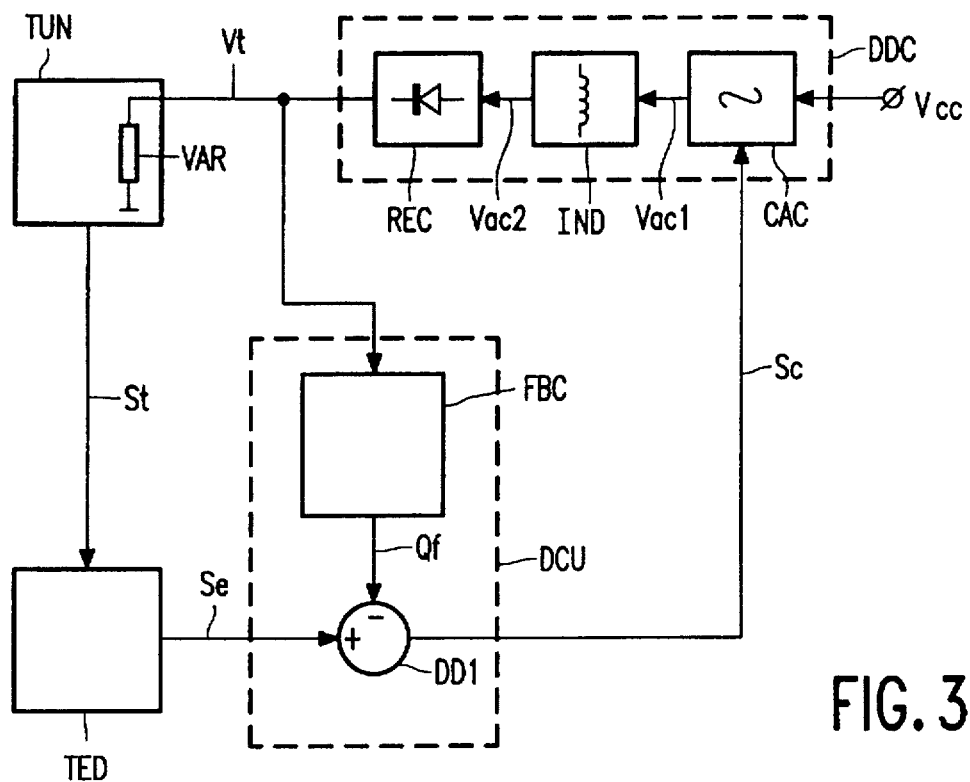
FIG. 3 shows a second embodiment of a tuning system according to the invention.

FIG. 3 shows a second embodiment which is in many respects similar to the embodiment in FIG. 2. However, in FIG. 3 the controller DCU comprises a feedback circuit FBC. This feedback circuit FBC derives a feedback quantity Qf from the output voltage Vt of the DC-DC converter DDC. A difference detector DD1 compares the tuning error signal Se with this feedback quantity, to produce the control signal Sc for the AC source CAC in the DC-DC converter DDC. Thus, in addition to the tuning error signal Se, the AC source CAC is also controlled in function of the output voltage of the DC-DC converter DDC.

In the second embodiment, shown in FIG. 3, the controller DCU and the DC-DC converter DDC constitute a feedback loop within the tuning control loop. In effect, the tuning error signal Se is the reference input signal for this feedback loop, the control signal Sc the actuating signal, and the tuning voltage Vt the controlled variable. The feedback loop brings the feedback quantity Qf in accordance with the tuning error signal Se. Due to the feedback loop, the transfer of tuning error signal Se to tuning voltage Vt is mainly determined by the feedback circuit FBC.

Figure 4:
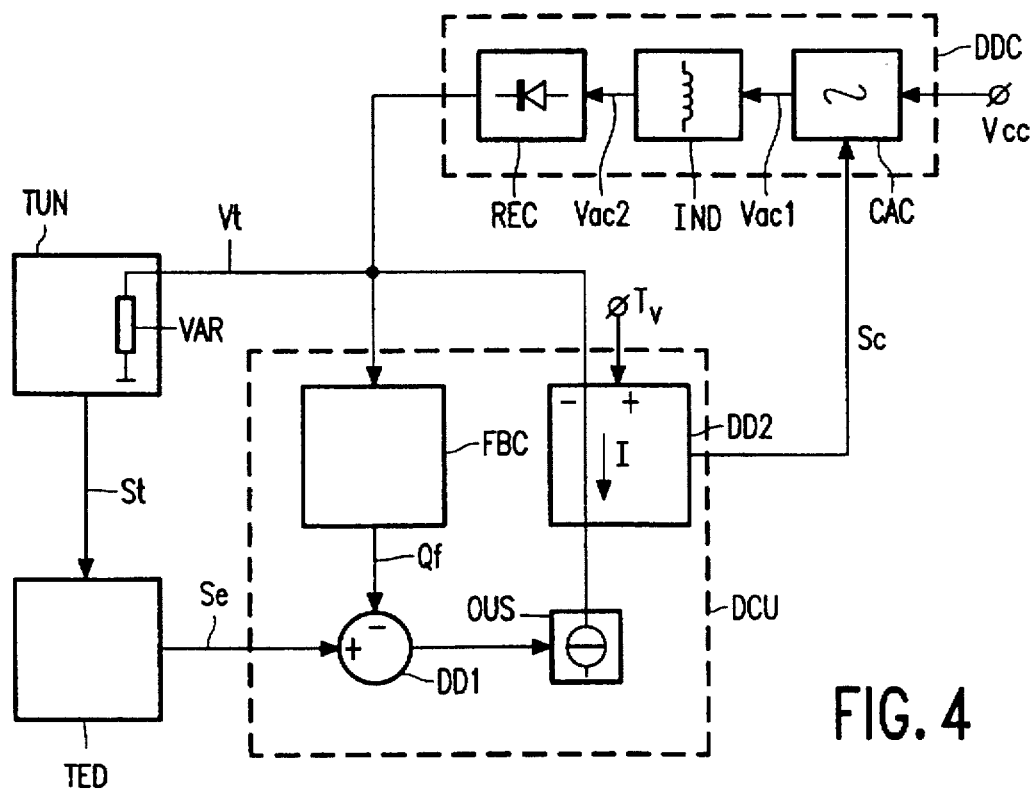
FIG. 4 shows a third embodiment of a tuning system according to the invention.

FIG. 4 shows a third embodiment with two internal feedback loops. A first internal feedback loop comprises the following main parts: feedback circuit FBC, the difference detector DD1 and an output section OUS. A second internal feedback loop comprises a difference detector DD2 and the DC-DC converter DDC. In FIG. 4 the second difference detector DD2 is also part of the first internal loop. However, it is not essential; the second difference detector DD2 may be omitted from the signal path which extends from the output section OUS to the feedback circuit FBC.

The first internal loop in the third embodiment, shown in FIG. 4, has the same function as the feedback loop in the second embodiment, shown in FIG. 3. That is, the feedback circuit FBC mainly determines the transfer of tuning error signal Se to the tuning voltage Vt. However, there is a significant difference between these aforementioned loops. In FIG. 3, the DC-DC converter DDC is part of the feedback loop, whereas, in FIG. 4, the DC-DC converter DDC is, as such, not part of the first internal loop.

The second internal loop stabilizes an output current I from the output section OUS. Current I is drawn from the DC-DC converter DDC which is part of the second internal loop. Current I, or a replica of current I, flows through difference detector DD2 which compares this current I with a target value Tv. Difference detector DD2 controls the AC source CAC in response to this comparison. In effect, the target value Tv is the reference input signal for the second internal control loop, the control signal Sc the actuating signal and the current I drawn from the DC-DC converter DDC is the controlled variable.

Some implementations of the above embodiments will now be presented, to further clarify the invention.

Figure 5:
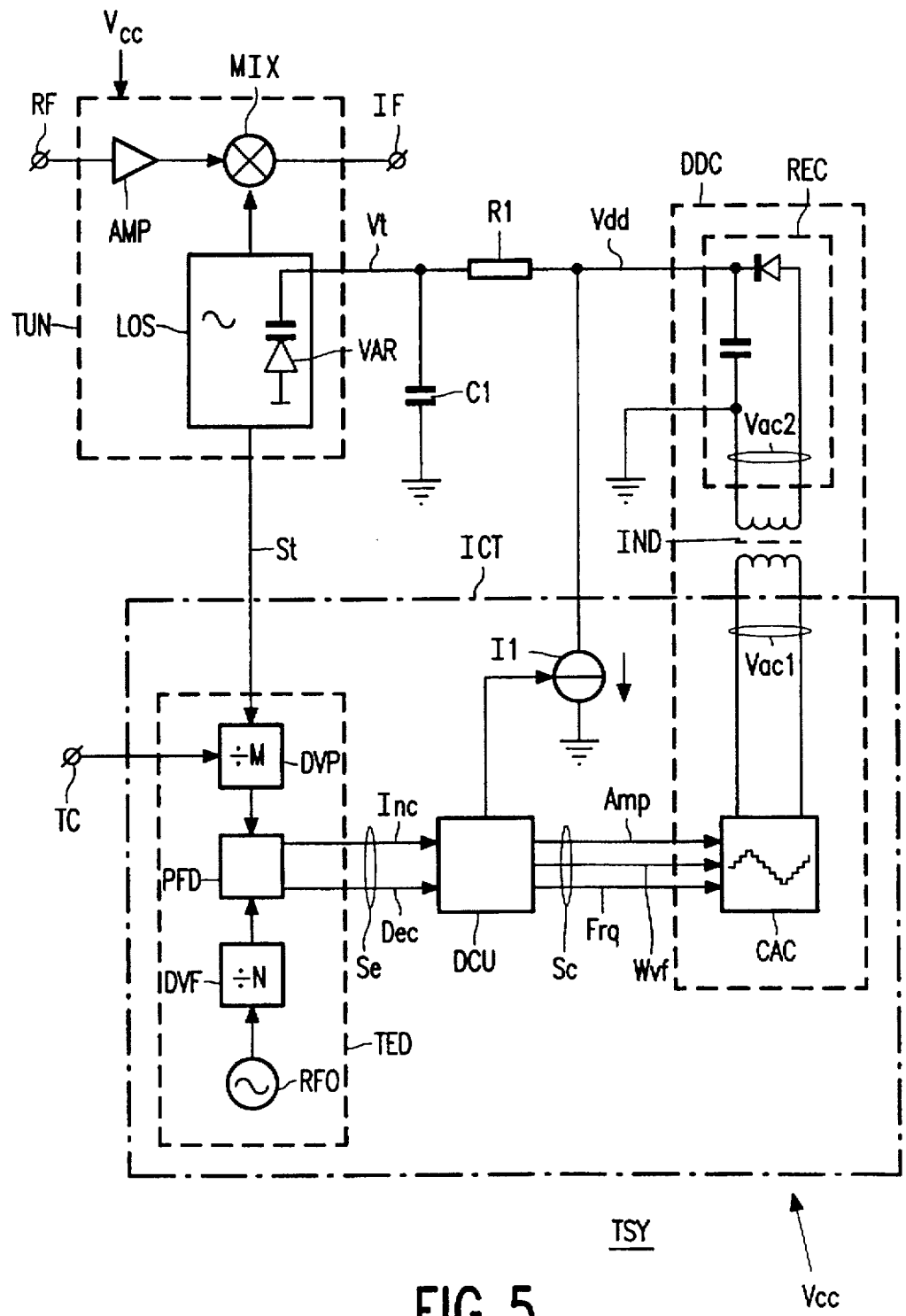
FIG. 5 shows a first implementation of the first embodiment shown in FIG. 2.

FIG. 5 shows a first implementation of the embodiment shown in FIG. 2. In a tuning system TSY, shown in FIG. 5, a tuner TUN frequency converts an input signal RF supplied thereto into an output signal IF. The frequency conversion in tuner TUN is determined by a tuning command signal TC.

The frequency conversion in the tuner TUN is effectuated by a combination of a mixer MIX and a local oscillator LOS. The mixer MIX multiplies the input signal RF, which it receives via amplifier AMP, with an output signal of the local oscillator LOS. As a result, the frequency of the RF input signal is shifted by an amount equal to the frequency of the local oscillator signal supplied to the mixer MIX. This frequency shifted RF signal is the output signal IF of tuner TUN.

The frequency of the local oscillator LOS depends on the tuning voltage Vt supplied thereto. In this implementation, the local oscillator LOS comprises a resonance circuit (not shown) which determines its frequency. The resonance circuit comprises a varicap diode VAR which varies the oscillation frequency in function of the tuning voltage Vt. The tuning system TSY controls the tuning voltage Vt such that the tuner TUN effectuates a frequency conversion in accordance with the tuning command signal TC.

In the tuning error detector TED, the output signal St of the local oscillator LOS is frequency divided by a programmable frequency divider DVP. The division ratio of this divider is determined by the tuning command signal TC. The frequency divided output signal St is a first input signal of a phase-frequency detector PFD. A second input signal of the phase-frequency detector PFD is a frequency divided output signal of a reference frequency oscillator RFO. The frequency division of the output signal is effectuated by a fixed frequency divider DVF.

The phase-frequency detector PFD provides a tuning error signal Se in response to the first and second input signals supplied thereto. The tuning error signal Se comprises two binary signals 'Inc' and 'Dec', respectively. These two binary signals 'Inc' and 'Dec' effectively indicate three possible conditions. One condition is that the first input signal derived from the local oscillator LOS is synchronous with the second input signal derived from the reference frequency oscillator. In that case, both binary signals 'Inc' and 'Dec' are '0'. In the other two conditions, the input signals of the phase-frequency detector PFD are non-synchronous. In the case that the first input signal is lagging in phase and/or frequency with respect to the second input signal, the binary signals 'Inc' and 'Dec' are '1' and '0', respectively. In the opposite case the binary signals 'Inc' and 'Dec' are '0' and '1', respectively.

In effect, the tuning error signal Se indicates whether or not the tuner TUN is in the desired tuning state. If not, the tuning error signal 'Se' indicates, in addition, that either the frequency of the local oscillator LOS has to be increased or that it has to be decreased to achieve the desired tuning state. It is deemed unnecessary to discuss further detail the functional parts of the tuning error detector TED, shown in FIG. 5. Those skilled in the art can readily conceive implementations of any of these functional parts.

The controller DCU can be implemented in various ways using digital signal processing elements. The function of the controller DCU is similar to that of a loop filter and/or loop amplifier in prior art tuning loops. The control signal Sc is, basically, a low-pass filtered version of the tuning error signal Se. The control signal Sc comprises a component 'Amp' and, optionally, components 'Frq' and 'Wvf'. If the tuning error is large, the component 'Amp' in the control signal Sc is active. If the tuning error is small, the components 'Frq' and/or 'Wvf' are active.

The DC-DC converter DDC is implemented as follows. The controllable AC source comprises a numerical oscillator (not shown) which provides a digital oscillation signal. The amplitude and, optionally, the frequency and the waveform of the digital oscillation signal is determined by components 'Amp', 'Frq' and 'Wvf' of the control signal Sc, respectively. The digital oscillation signal is supplied to an D/A-converter which provides an AC output voltage Vac1 in response thereto. A transformer circuit IND transforms this voltage into an AC voltage Vac2 of higher amplitude. The AC voltage Vac2 is rectified by a diode in the rectifier circuit REC further comprising a capacitor. Accordingly, a DC voltage Vdd is produced at the output of the rectifier circuit REC. This voltage is supplied to the varicap VAR in the tuner local oscillator LOS via resistor R1 and capacitor C1 which constitute a low-pass filter.

The value of the tuning voltage Vt can be varied by changing the properties of the first AC voltage Vac1. Clearly, a change in amplitude of the first AC voltage Vac1 will change the tuning voltage Vt. In addition, a change in waveform and/or in frequency may equally change the tuning voltage Vt. This is due to the fact that, in practice, the gain of the transformer circuit IND is frequency dependent. A change in waveform and/or in frequency of the first AC voltage Vac1 can be used for a fine control of the tuning voltage Vt, the coarse control being effectuated by adjusting the amplitude of the first AC voltage Vac1.

To increase the speed of tuning, a controllable current source I1 is included in the tuning system. Without this current source, capacitor C1 would produce an annoying inertia. Suppose the amplitude of the second AC voltage Vac2 is lowered to in order to reduce the tuning voltage Vt. Without current source I1, it would take a relatively long time for the capacitor C1 to be discharged. This is because the diode in the rectifying circuit is non-conducting and constitutes a high impedance with respect to signal ground. The discharge time-constant is relatively large. This problem is circumvented by activating current source I1 when a significant reduction of tuning voltage is required for example, when the tuning error signal Se indicates so. In that case, the current source discharges capacitor C1 until the desired tuning voltage is approximated. The current source I1 is then disabled and the DC-DC converters takes over the control of the tuning voltage Vt.

The functional parts in FIG. 5 located within the dotted square denoted as ICT may be housed on a single integrated circuit. Present-day synthesizer integrated circuits often comprise parts corresponding to the tuning error detector TED shown in FIG. 5. An integrated circuit according to the invention could also comprise such parts and, in addition, the controller DCU and the AC source CAC of the DC-DC converter. The other parts of the DC-DC converter may then be constituted by components external to this integrated circuit.

Both the tuner TUN and the integrated circuit ICT in FIG. 5 operate at a supply voltage Vcc. This supply voltage may be 5 volts, for example, which is the value that is commonly used in logical circuits. In that case, the maximum peak-peak amplitude of AC voltage Vac1 is 5 volts, which is transformed to a higher value by the inductive element IND and subsequently rectified to produce DC voltage Vdd. Accordingly, DC voltage Vdd may well exceed the 5 volt supply voltage Vcc. For example, DC voltage Vdd may vary within a range of 0 to 30 volts in order to tune the local oscillator LOS over the desired frequency band.

Figure 6:
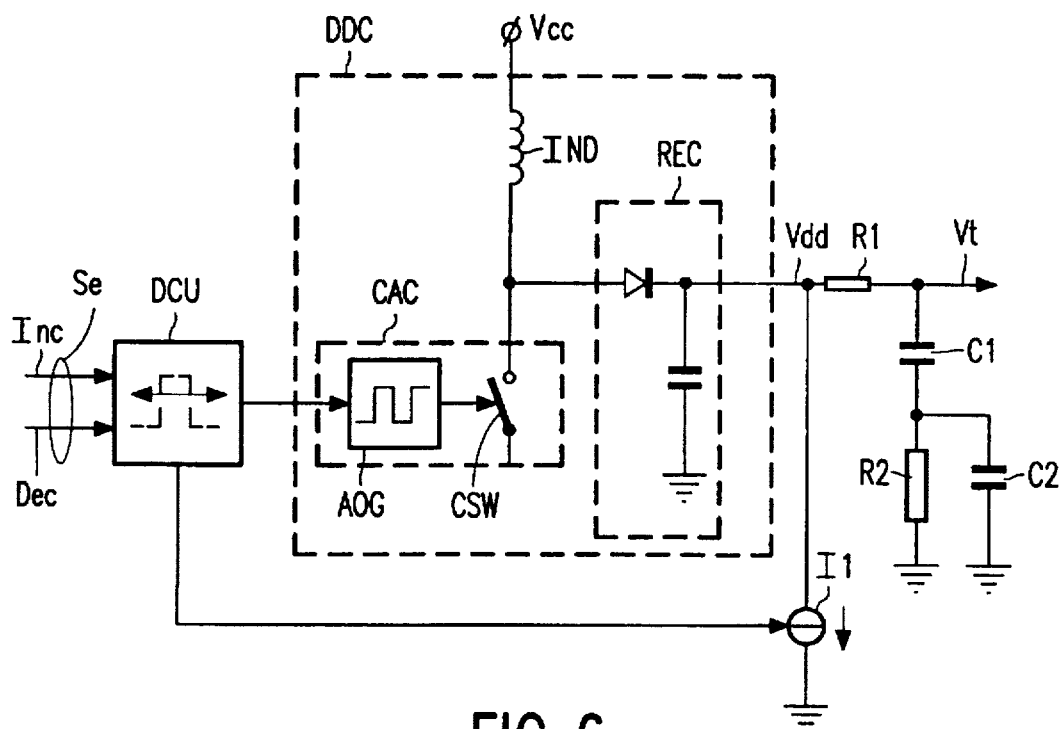
FIG. 6 shows a second implementation of the first embodiment shown in FIG. 2.
Figure 7:
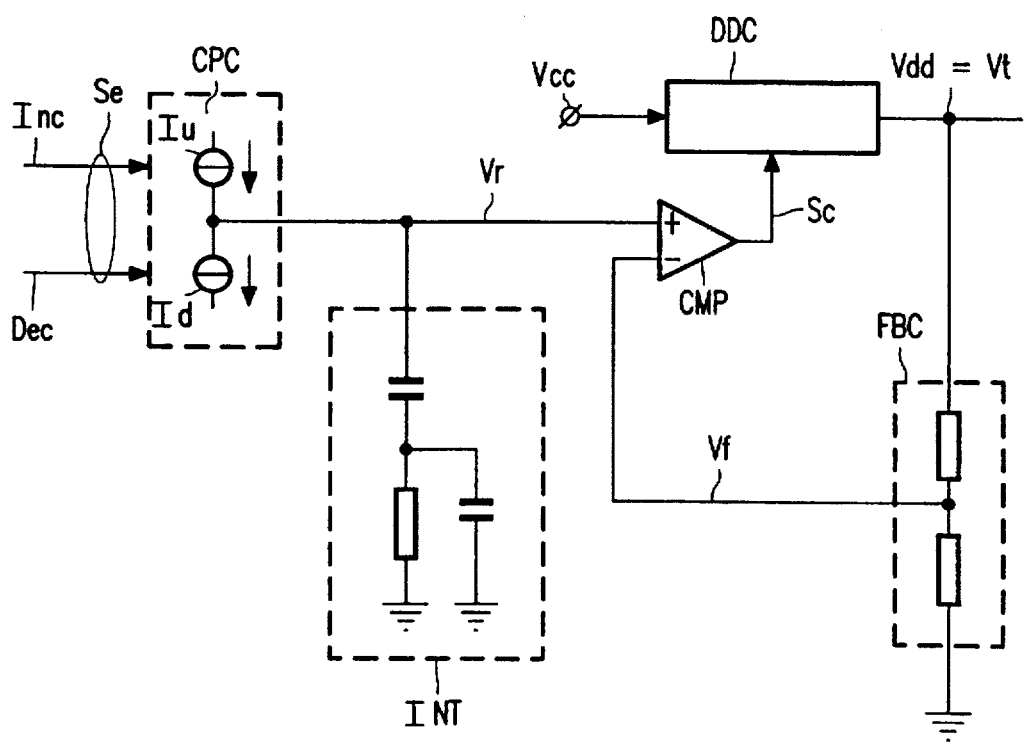
FIG. 7 shows an implementation of the second embodiment shown in FIG. 2.
Figure 8:
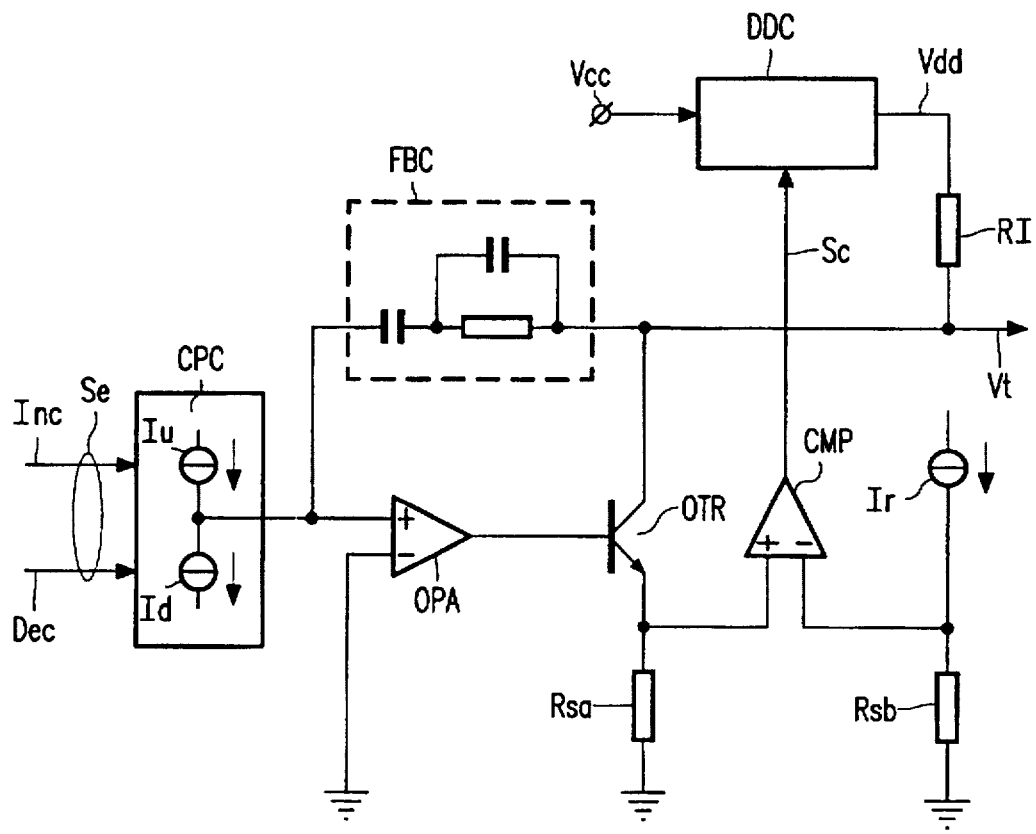
FIG. 8 shows an implementation of the third embodiment shown in FIG. 4.

FIGS. 6, 7 and 8 illustrate further implementations. For reasons of conciseness, only those elements are shown which derive the tuning voltage Vt from the tuning error signal Se. In FIGS. 6, 7 and 8, tuning error signal Se comprises binary signals 'Inc' and 'Dec' as in FIG. 5.

FIG. 6 illustrates a second implementation of the first embodiment shown in FIG. 2. In FIG. 6, the AC source CAC of the DC-DC converter DDC is in the form of a controllable switch CSW which is rendered alternately conducting and non-conducting by means of an alternate on/off generator AOG. The controllable switch CSW is arranged between a node of a coil IND and signal ground. The other node of the coil IND is connected to supply voltage Vcc. The coil IND can be seen as a current storage medium. The current stored in the coil IND is the current which flows from Vcc to signal ground when the switch CSW conducting, i.e., closed. When the switch CSW is opened the current stored in the coil IND continues to flow and charges the capacitor in the rectifier circuit REC. Such a charge operation allows the DC voltage Vdd, provided by the rectifier circuit REC, to exceed the value of supply voltage Vcc.

The value of the DC voltage Vdd and, consequently, the value of the tuning voltage Vt, depends on the duration of the period of non-conductance of switch CSW relative to the period of conductance. This is further referred to as the duty cycle. To control the duty cycle as a function of the tuning error signal Se, the controller DCU transforms the binary signals 'Inc' and 'Dec' into a duty cycle control signal Sc, which is supplied to the alternate on/off generator AOG. The duty cycle control can be very straightforward; in response to 'Inc', the period of conductance of switch SWC can be increased, and in response to 'Dec', it can be decreased, or vice versa.

The combination of resistors R1, R2 and capacitors C1, C2 constitutes a loop filter. The transfer of this loop filter is characterized by two poles and one zero. Apart from determining some tuning control characteristics, the loop filter also removes residual AC signals at the output of the DC-DC converter which may parasitically modulate the local oscillator.

FIG. 7 shows an implementation of the second embodiment shown in FIG. 3. In FIG. 7, the tuning error signal Se is supplied to a charge pump circuit CPC which comprises two controllable current sources Iu and Id, respectively. In response to the binary signals 'Inc' and 'Dec', either current source Iu or Id is activated. In the case current source Iu is activated, is a current is supplied to integrator circuit INT thereby increasing a voltage Vt. In the case Id is activated a current Id is drawn from the integrator circuit INT thereby decreasing the voltage Vr.

The voltage Vr, obtained by integrating the output current of the charge pump circuit CPC, is in effect, the reference for a loop constituted by a comparator circuit CMP, the DC-DC converter DDC and the feedback circuit FBC. The loop adjusts the value of the DC-DC converter output voltage Vdd, which is also the tuning voltage Vt, such that voltage Vf is equal to voltage Vr. In effect, the loop scales the voltage Vr up to the tuning voltage Vt. The scaling factor is determined by the feedback circuit FBC which is a voltage divider. The scaling factor is the inverse of the voltage division ratio.

FIG. 8 shows an implementation of the third embodiment shown in FIG. 4. Like in FIG. 7, the implementation shown in FIG. 8 comprises a charge pump circuit CPC. The output current of this charge pump circuit CPC is supplied to an active integrator, constituted by an op-amp OPA, an output transistor OTR and a feedback circuit FBC. The active integrator corresponds to the first internal loop in the embodiment shown in FIG. 4. The active integrator converts the output current of the charge pump circuit CPC into a tuning voltage Vt. The current-to-voltage conversion characteristic is determined by the feedback circuit FBC.

The implementation, shown in FIG. 8, further comprises a current stabilizing loop, which comprises the DC-DC converter DDC, the output transistor OTR and a comparator CMP. This current stabilizing loop fixes the bias current flowing through the output transistor OTR at a target value determined by a reference current source Ir. Furthermore, the current stabilizing loop indirectly controls the output voltage Vdd of DC-DC converter DDC. The bias current of output transistor OTR is the main part of the current drawn from the DC-DC converter DDC via a resistor R1. Hence, the current stabilizing loop tries to keep the output voltage Vdd of the DC-DC converter DDC at a predetermined level above the tuning voltage Vt. The predetermined level depends on the current of reference source Ir and the value of resistor R1.

The current stabilizing loop operates as follows. The bias current of output transistor OTR flows through a resistor Rsa and causes a voltage drop which is applied to the inverting (−) input of comparator circuit CMP. The non-inverting (+) input receives a reference voltage drop across a resistor Rsb. The reference voltage drop is caused by a reference current from the reference current source Ir. In steady state, the voltage drop across the resistor Rsa is equal to the reference voltage drop across resistor Rsb.

If the bias current of the output transistor OTR changes, the control signal Sc will cause the output voltage Vdd of the DC-DC converter DDC to change. Assuming that the tuning voltage Vt remains constant, the current flowing through the resistor R1 will change, as a result. In that case, resistor R1 can be considered to be a current source, whose output current differs from the bias current of output transistor OTR. A difference current will flow through the feedback circuit FBC of the first loop causing a change in the voltage at the non-inverting (−) input of the operational amplifier OPA. The change in voltage is transferred to the control terminal of the output transistor OTR, making that the bias current of this transistor is adjusted in the desired direction.

Figure 9:
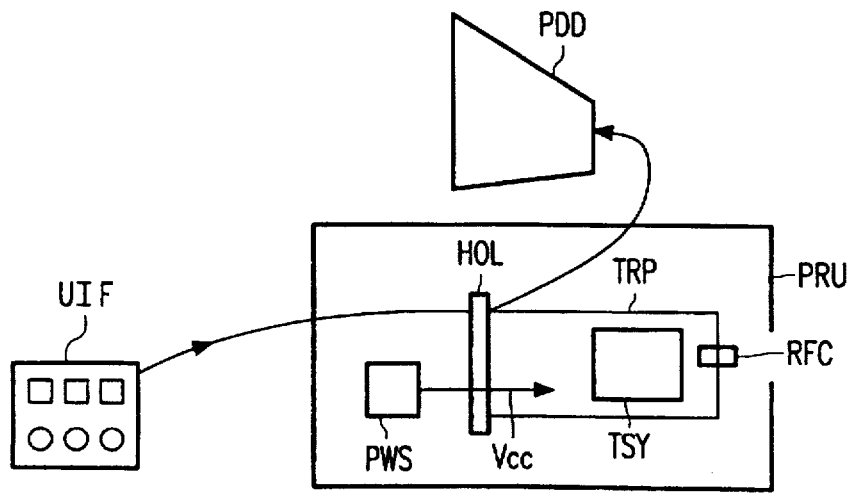
FIG. 9 represents a multi-media apparatus according to the invention.

FIG. 9 shows an embodiment of a multi-media apparatus according to the invention having a processing unit PRU, a picture display device PDD and a user interface UIF. The processing unit comprises a television reception board TRP plugged into a holder HOL. The television reception board TRP is effectively a television receiver and comprises a tuning system TSY according to the invention, for example, a tuning system as shown in FIG. 5. The tuner TUN (not shown) in the tuning system TSY receives the RF input signal via a connector RFC which is, for example, a coaxial cable connector. The circuitry on the television reception board TRP is powered from a power supply PWS which supplies voltage Vcc via the holder HOL to the tuning system Vcc.

Highlighted here below are some advantages provided by the invention. This is with reference to the embodiments and implementations shown by way of example.

A multi-media apparatus according to the invention does not require additional supply voltage provisions, for tuning systems incorporated therein. The television reception board TRP shown in FIG. 9 can operate at a single supply voltage Vcc. This supply voltage may be 5 volts, the same supply voltage used to operate logic circuits in the processing unit PRU. The tuning system TSY is capable of locally generating a tuning voltage Vt which exceeds the supply voltage Vcc, for example, a tuning voltage Vt in a range between 0 and 30 volts.

In many applications, a tuning system according to the invention doesn't produce noticeable interference. The disturbing field emitted by the inductive element, which is part of the DC-DC converter, is relatively weak due to fact that it has to transfer relatively little power to the tuning element. The tuning elements draw relatively little current from this DC-DC converter. For example, in FIG. 5, the varicap diode VAR constitutes the tuning element. The varicap diode will only take up a current in the order of a few micro-Amperes.

The second embodiment, shown in FIG. 3, is of relatively simple structure. The controller DCU and, partially, the AC source CAC may be in the form of logic circuits housed together with the tuning error detector TED on a digital MOS integrated circuit.

Furthermore, the second embodiment, shown in FIG. 3, is substantially insensitive to component characteristic spread in the DC-DC converter. Due to the feedback loop, comprising feedback circuit FBC, any spread in the characteristics of the inductive element IND, for example, hardly affects the tuning control characteristics.

The third embodiment, shown in FIG. 4, can have a relatively high tuning speed. In this embodiment, the DC-DC converter DDC does not substantially affect the speed at which the tuning voltage Vt responds to the tuning error signal Se. The bandwidth of the transfer of control signal Sc to output voltage Vdd, via the DC-DC converter DDC, may be relatively small. Both in FIG. 4 and in FIG. 8 the DC-DC converter DDC is effectively outside the signal path, which extends from the point at which the tuning error signal Se is present to the point at which the tuning voltage Vt is present.

While a limited number of embodiments are shown and described by way of example, a person skilled in the art may conceive many other alternative embodiments without departing from the spirit and the scope of the invention claimed.

Figure 1A:
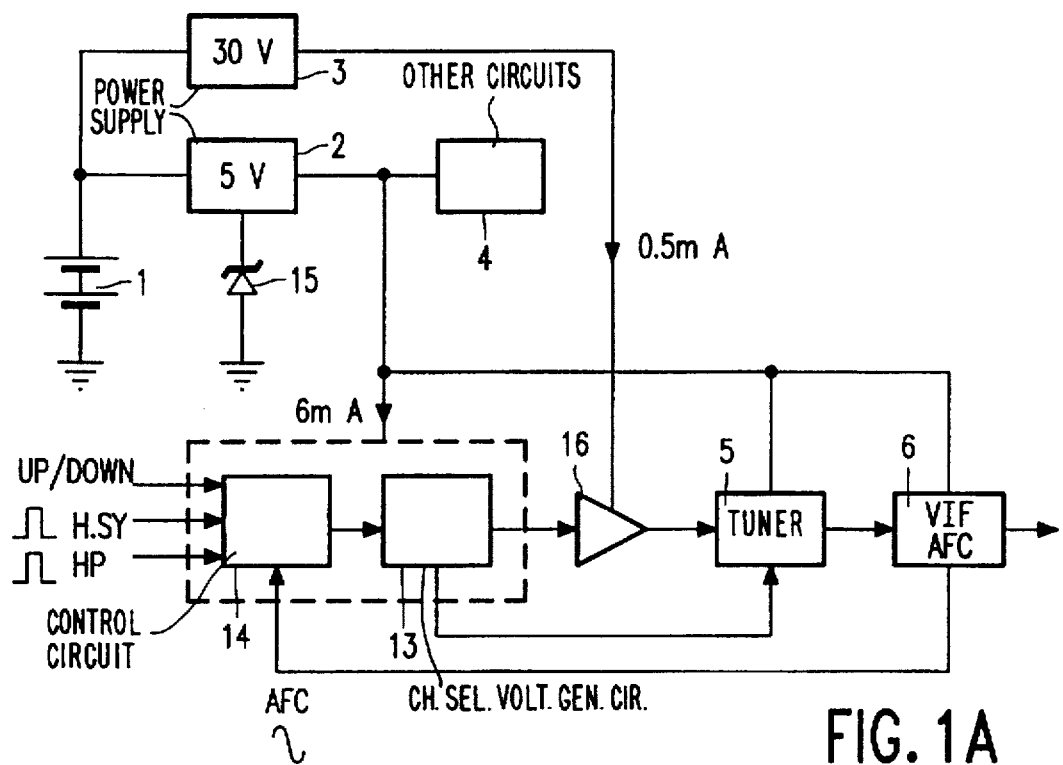
FIGS. 1A and 1B show a prior art tuning system.
Figure 1B:
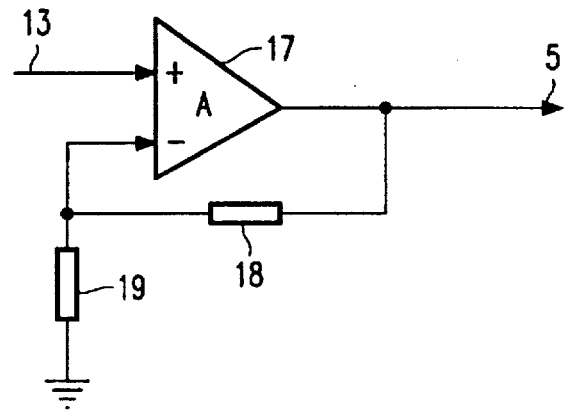

For example, the tuning error detector TED may be of a type similar to that in the prior art tuning system shown in FIG. 1. This tuning error detector derives the tuning error signal from an IF output signal provided by the tuner, in stead of a local oscillator signal as in FIG. 5.

The tuning element may comprise a MOS transistor, whose gate is coupled to the DC-DC converter. The MOS transistor constitutes a high impedance load for the DC-DC converter. Further, in RC-type oscillators, MOS transistors themselves may constitute tuning elements, which vary the oscillation frequency in response to a tuning signal.

It is evident that various types of controllable DC-DC converters may be used. In the embodiments shown in FIGS. 2, 3 and 4, the inductive element IND in a DC-DC converter may be a simple coil, a transformer circuit or any other structure which exhibits an inductance. The AC source CAC may be a numerical, an analog or any other type of oscillator supplying a periodic signal of some waveform. Preferably, sine-like waveforms are used to minimize harmonics in the field emitted by the DC-DC converter.

To promote high speed tuning, a high pass circuit can be coupled in parallel with the DC-DC converter.

In summary, the following has been described in this specification. In a tuning system, a DC-DC converter provides the tuning control voltage for the tuner. The DC-DC converter is in the form of a series arrangement of an AC source, an inductive element and a rectifier circuit. The AC signal provided by the AC source is controlled by a tuning error signal from a tuning error detector. The inductive element transforms this AC signal into an AC signal of higher amplitude. The latter AC signal is rectified to provide the tuning control voltage. In effect, the DC-DC converter is part of a tuning control loop. This tuning control loop determines the output voltage of the DC-DC converter.

I claim:

1. A tuning system comprising:

a tuner;

a tuning detector for providing a tuning-error signal which depends on the tuning state of said tuner;

a controllable DC-DC converter whose output voltage depends on the tuning-error signal;

a feedback circuit for deriving a feedback signal from the output voltage of the controllable DC-DC converter;

a difference detector for controlling the controllable DC-DC converter in response to the difference between said feedback signal and said tuning error signal; and tuning means for varying the tuning state of said tuner in response to the output voltage of the controllable DC-DC converter.

2. A tuning system comprising:

a tuner;

a tuning detector for providing a tuning-error signal which depends on the tuning state of said tuner;

a controllable DC-DC converter whose output voltage depends on the tuning-error signal;

an output section for drawing a current from the controllable DC-DC converter in response to the tuning-error signal;

a difference detector for controlling the controllable DC-DC converter in response to the difference between said current and a target value; and tuning means for varying the tuning state of said tuner in response to the output voltage of the controllable DC-DC converter.

3. A receiver comprising:

a combination of a mixer and a local oscillator for converting an input signal in frequency;

a reference-frequency oscillator;

a phase-frequency detector having a first input for receiving an output signal from the local oscillator, and a second input for receiving an output signal from the reference-frequency oscillator, the phase-frequency detector being arranged for providing a tuning-error signal in response to the signals received at its first and second inputs;

a controllable DC-DC converter whose output voltage depends on the tuning-error signal; and tuning means for varying the frequency of the local oscillator in response to the output voltage of the controllable DC-DC converter.

4. A multimedia apparatus having a reception board comprising:

a combination of a mixer and a local oscillator for converting an input signal in frequency;

a reference-frequency oscillator;

a phase-frequency detector having a first input for receiving an output signal from the local oscillator, and a second input for receiving an output signal from the reference-frequency oscillator, the phase-frequency detector being arranged for providing a tuning-error signal in response to the signals received at its first and second inputs;

a controllable DC-DC converter whose output voltage depends on the tuning-error signal; and tuning means for varying the frequency of the local oscillator in response to the output voltage of the controllable DC-DC converter.

5. A circuit arrangement, comprising an integrated frequency-control circuit, for controlling the frequency of an external oscillator, the integrated frequency-control circuit comprising:

a first input for receiving an output signal from the external oscillator;

a second input for receiving an output signal from a reference-frequency oscillator;

a phase-frequency detector being arranged for providing a tuning-error signal in response to the signals received at the first and second inputs;

an AC source for providing an AC signal at an output; and control means for varying at least one property of the AC signal in response to the tuning-error signal, said circuit arrangement further comprising means for rectifying said AC signal, an output from said rectifying means being used to control the frequency of said external oscillator, wherein said AC source and said rectifying means form a DC-DC converter.

* * * * *